(12) United States Patent
Brunner

(10) Patent No.: US 8,928,390 B2
(45) Date of Patent: Jan. 6, 2015

(54) METHOD TO IMPROVE RESPONSE SPEED OF RMS DETECTORS

(71) Applicant: Analog Devices Technology, Hamilton (BM)

(72) Inventor: Eberhard Brunner, Waakirchen (DE)

(73) Assignee: Analog Devices Global, Hamilton (BM)

(*) Notice: Subject to any disclaimer, the term of this patent is extended or adjusted under 35 U.S.C. 154(b) by 0 days.

(21) Appl. No.: 13/848,929

(22) Filed: Mar. 22, 2013

(65) Prior Publication Data

US 2014/0285249 A1  Sep. 25, 2014

(51) Int. Cl.
*G06G 7/20* (2006.01)
*G01R 19/02* (2006.01)

(52) U.S. Cl.
CPC ..................... *G01R 19/02* (2013.01)
USPC ......................................... 327/348

(58) Field of Classification Search
USPC ......................................... 327/348
See application file for complete search history.

(56) References Cited

U.S. PATENT DOCUMENTS

| 4,617,474 | A  | * | 10/1986 | Jason ............................ 327/104 |
| 5,585,757 | A  | * | 12/1996 | Frey ............................. 327/348 |
| 5,838,194 | A  | * | 11/1998 | Khoury ......................... 330/139 |
| 6,429,720 | B1 | * | 8/2002  | Gilbert ......................... 327/348 |
| 6,750,713 | B1 | * | 6/2004  | Wyszynski ..................... 330/254 |
| 7,538,614 | B1 | * | 5/2009  | Wedel .......................... 330/258 |
| 7,777,552 | B1 | * | 8/2010  | Gilbert ......................... 327/350 |
| 8,081,778 | B2 | * | 12/2011 | Farley .......................... 381/110 |
| 8,154,263 | B1 | * | 4/2012  | Shi et al. ...................... 323/269 |
| 8,358,166 | B2 | * | 1/2013  | Meyer .......................... 327/348 |
| 8,373,487 | B1 | * | 2/2013  | Roger .......................... 327/336 |
| 8,422,970 | B1 | * | 4/2013  | van Staveren et al. ......... 455/130 |
| 2009/0164051 | A1 | * | 6/2009 | Vervoordeldonk ........... 700/302 |
| 2009/0284300 | A1 | * | 11/2009 | Meyer ......................... 327/348 |
| 2010/0194461 | A1 | * | 8/2010 | Kouwenhoven ............. 327/348 |
| 2012/0192702 | A1 | * | 8/2012 | Arnold ............................ 84/736 |
| 2012/0274403 | A1 | * | 11/2012 | Kim et al. ..................... 330/278 |
| 2014/0043098 | A1 | * | 2/2014 | Rozenblit ..................... 330/134 |

* cited by examiner

*Primary Examiner* — Adam Houston
(74) *Attorney, Agent, or Firm* — Marger Johnson & McCollom PC

(57) ABSTRACT

A root-mean-square (RMS) detector includes detection circuitry having as an input a radio frequency signal, target voltage and a set voltage and a RMS signal as an output, and a gain stage within the detection circuitry to produce the RMS signal as an output. The gain stage provides for faster settling times of the detector.

19 Claims, 5 Drawing Sheets

METHOD TO IMPROVE RESPONSE SPEED OF RMS DETECTORS

TECHNICAL FIELD

This disclosure relates to RMS power detectors, more particularly to improving the settling time of such detectors.

BACKGROUND

Root Mean Square (RMS) power detectors output a direct current (DC) voltage that is proportional to the input signal power of a waveform. Typically, systems use RMS detectors to detect the power of a Radio Frequency (RF) signal waveform. The RMS detector generally needs a certain amount of integration to determine the RMS value of a signal. The amount of time depends upon the 'crest factor,' which is the peak-to-average ratio calculated from the peak amplitude of the waveform divided by the waveform's RMS value.

An issue that arises with RMS detectors lies in the response of the detector to rapid changes between high and low power levels. When the power level changes quickly from low to high, the input of the RF detector suddenly sees a much larger input signal. In response, it generates a large rectified or squared output signal. The output signal of the detector typically consists of a current. The resulting error current, $I_{RF-RMS}$ minus $I_{SET}$, can get quite large and changes the voltage of the filter very quickly.

However, when the signal changes quickly from high to low, the filter does not discharge very quickly. Typically RMS detectors use an automatic gain control (AGC) with a setpoint approach to extend the dynamic range of the detector, also referred to as a squaring cell. These detectors may add a variable gain amplifier (VGA) before the detector and use a second identical detector that has a target voltage, or set point, applied. This second detector with the set point will generate a DC current, typically balanced by the RMS current derived from the RF signal by the VGA and RMS detector. When the signal changes quickly from high to low, the only current available to discharge the filter is the DC current from the set point detector. The resulting problem is that the settling time for rising input signals is much shorter than for falling input signals.

For modem communication signal waveforms with very high crest factors, the required filter capacitor may be rather large to get the required RMS accuracy after settling. Generally, higher power signals are of more importance and require more measurement accuracy. In order to achieve this measurement accuracy, the filter capacitor of a low pass filter may be large enough to cause the falling edge of the high to low signal step to be excessively slow.

A second issue arises when the signal falls outside the VGA range. This causes the AGC loop to drive the detector output to the rails. Since the VGA levels the signal at the RF detector input to keep the detector operating in its optimal range, if the input signal to the VGA is either too large or too small to maintain the output signal level determined by the target DC input voltage, the output of the overall system will go to either the positive or negative supply rails value. When it rails to the positive supply, typically at the highest power levels, it will take even longer for the system to settle when the input power is reduced. This is because the larger voltage has to be reduced by the same fixed set-point current.

SUMMARY

A root-mean-square (RMS) detector includes detection circuitry having as an input a radio frequency signal, target voltage and a set voltage and an output DC voltage that gives an indication of the RMS signal level, and a gain stage within the detection circuitry to produce the output voltage.

DETAILED DESCRIPTION OF THE EMBODIMENTS

Figure 1:
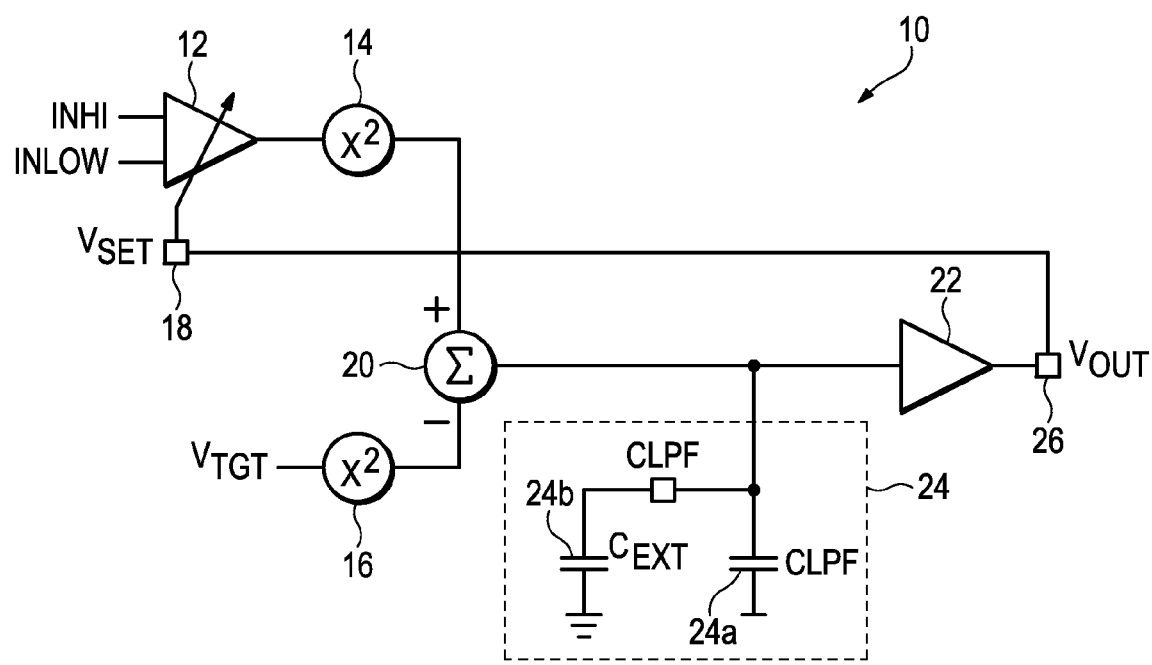
FIG. 1 shows a prior-art embodiment of an RMS detector.

FIG. 1 shows an embodiment of an RMS detector. They are used to detect the power of an incoming waveform and to produce an output voltage that is proportional to the power of the signal. In FIG. 1, the RMS detector 10 has an input stage variable gain amplifier (VGA) 12 that receives the high and low inputs of the incoming RF signal. The set voltage 18 controls the attenuation of the VGA. The VGA gain needs to decrease with increasing $V_{SET}$ to provide an increasing $V_{OUT}$ with increasing input signal level. The output of the VGA is then provided to a squaring circuit 14.

The output of the squaring circuit 14 is then summed with the output of a squaring circuit 16 that squares a target voltage. The output of the summing circuit 20, which is important to settling performance, is then provided to an output stage amplifier 22. The output voltage $V_{OUT}$ 26 is tied to the gain control voltage $V_{SET}$ 18. The output is then proportional to the logarithm of the RMS value of the input if the VGA gain is decreasing linear-in-dB with increasing input signal power.

In the embodiment of FIG. 1, the output VGA stage 22 consists of a linear gain amplifier. It maps the filter node variation to the VGA gain control voltage $V_{SET}$. When the RF input signal level to the VGA suddenly changes, then the output will also change depending on the filter capacitor 24 applied. During positive signal level steps, the output tends to rail as discussed above.

Figure 2:
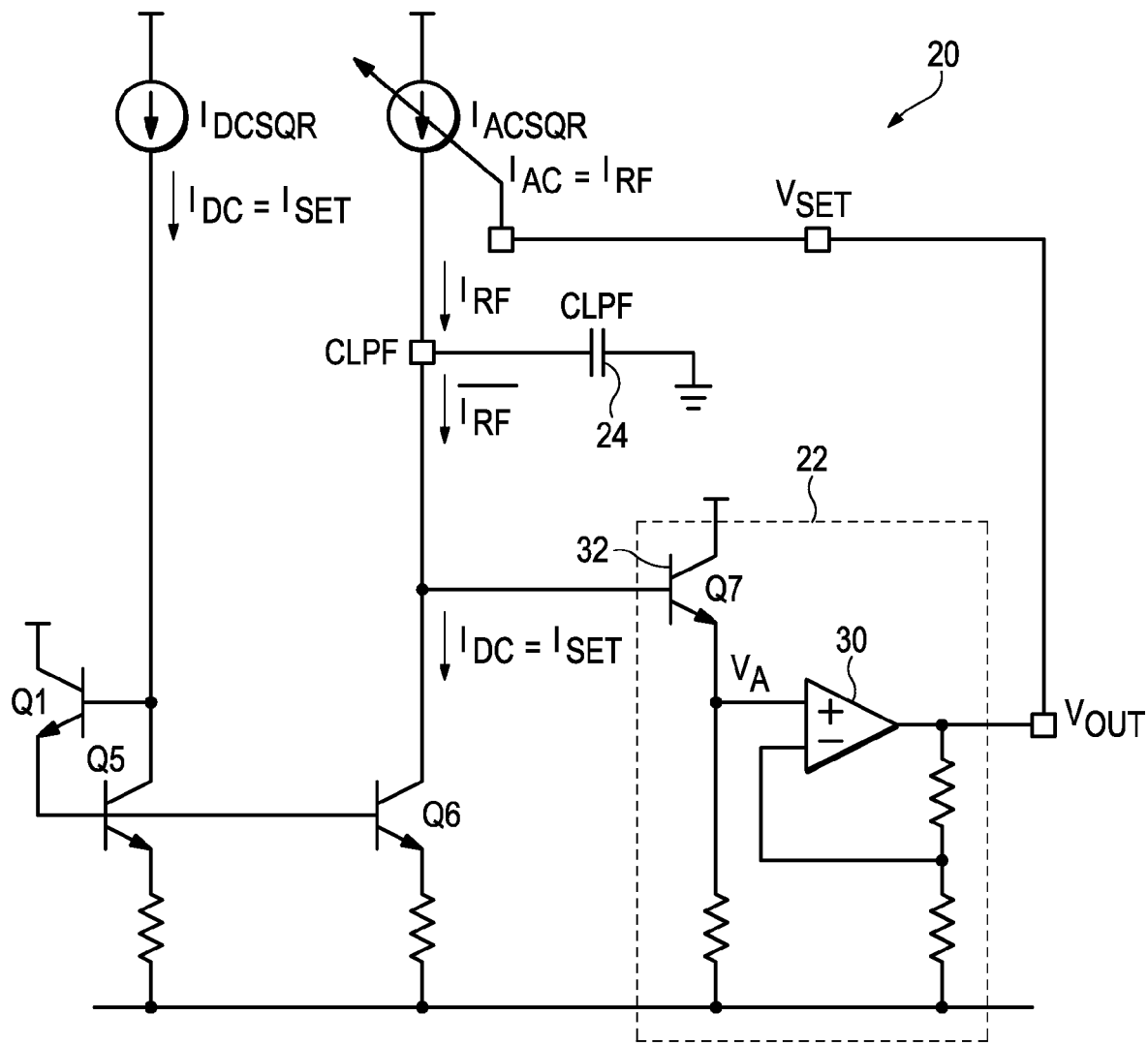
FIG. 2 shows a prior-art embodiment of an RMS detector.

FIG. 2 shows a more detailed embodiment of a portion of an RMS detector. The NPN follower 32 drives a gain-of-five amplifier 30. The follower at node $V_A$ requires a voltage swing to 0 V to 1 V for a 5V supply and a rail-to-rail operational amplifier (op-amp). The follower bias changes with signal level, which causes the loop response speed to vary. Since the VGA input, $V_{SET}$ driven from $V_{OUT}$, has a nominal working range of about 0.3 V to 3.7 V, it would be good to keep the $V_{OUT}$ voltage close to these limits −0V to 4V would give equal over and under range. Since the loop is controller-based, the output will rail once the VGA cannot regulate the filtered average $I_{RF}$ current to be equal to $I_{DC}$. During a positive rail event, only a fixed and relatively small $I_{DC}$ is available to pull the output back low, resulting in rather long falling edge times.

Figure 3:
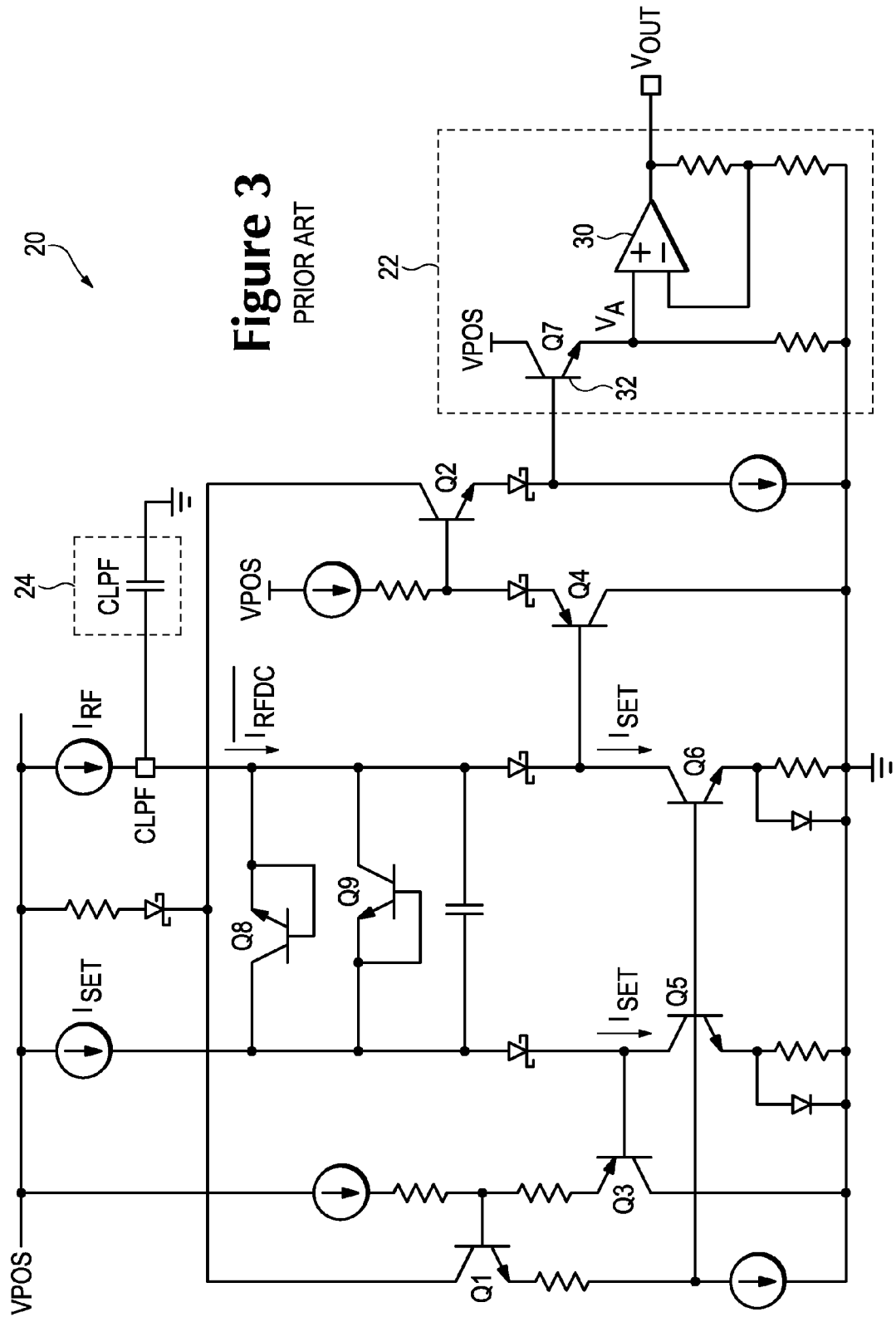
FIG. 3 shows a prior-art embodiment of a summing circuit.
Figure 4:
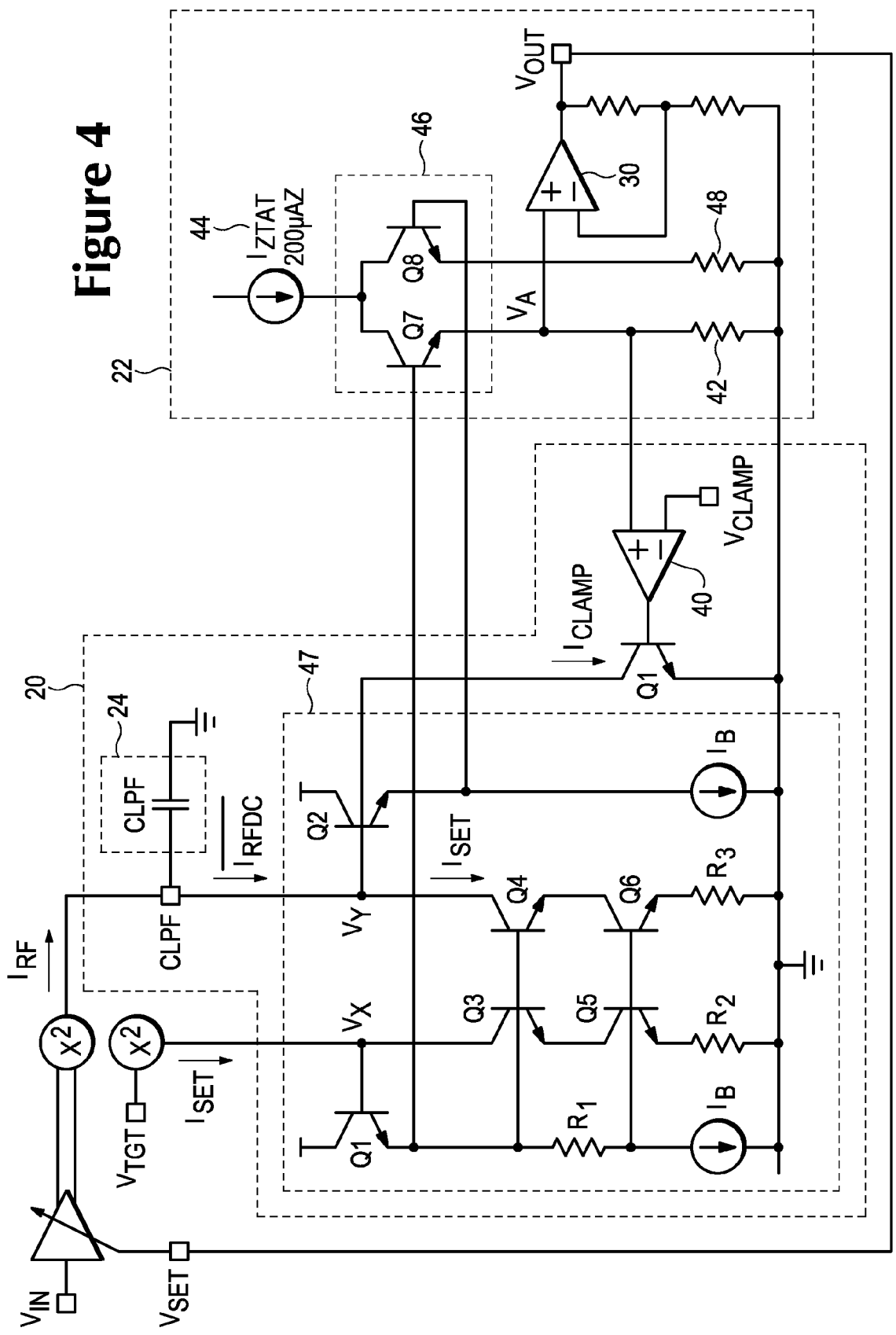
FIG. 4 shows an embodiment of an RMS detector having a gain stage and a clamping circuit.

In the embodiments discussed here, the addition of another gain stage 46, as shown in FIG. 4, instead of the NPN follower can limit the voltage swing on node CLPF and vastly improve the settling time. FIG. 3 shows the prior art summing circuit 20 in more detail. Output stage 22 is formed by follower Q7 and a gain-of-five op-amp. The voltage at $V_A$ will swing from 0 V to 1 V as $V_{OUT}$ swings from 0 to 5 V as explained earlier. This results in saturation of transistor Q6 of the current mirror which causes delay even for rising times. There is also no effective clamping to limit the positive excursion of $V_{OUT}$, thereby causing the output to rail when $V_{IN}$ suddenly steps high.

In the embodiment of FIG. 4, the 200 µAZ $I_{ZTAT}$ current source (constant with temperature, ZTAT) together with the resistor 42 limit the swing at the input of the op-amp 30 to a temperature stable 0-0.8V. This in turn regulates the output to 0-4V. A precision current mirror 47 has been added. Further, a separate clamping op-amp 40 generates an $I_{CLAMP}$ current. The $I_{CLAMP}$ current helps in shunting the large average $I_{RF}$ current away, during a large step from low to higher power at $V_{IN}$ and thereby limit the positive voltage swing on RMS filter capacitor CLPF 24. The precision of the overall RMS measurement depends greatly on the accuracy of current minor 47. The voltages $V_X$ and $V_Y$ are approximately equal when the measurement loop is closed, that is when $V_{OUT}$ is connected to $V_{SET}$, and a signal level within the nominal measurement range is applied.

Transistor Q2 is needed to replicate the base current of Q1 on the $I_{SET}$ side of the minor on the $I_{RF}$ side; both are biased with the same bias current $I_B$ to insure that both $I_{SET}$ and $I_{RF}$ see equal error currents. Gain stage 46, formed of Q7 and Q8, is key to allowing the voltages at Vx and Vy to be shifted to a high enough voltage such that a precision current minor without saturation can be implemented. Furthermore, gain stage 46 together with resistor 42 and ZTAT current source 44 aids in clamping $V_{OUT}$ to a voltage less than $V_{POS}$. This also allows the limit to be tailored to the range of $V_{SET}$. $V_{OUT}$ may also be referred to as the output RMS signal, as it will typically consist of an output DC voltage that indicates a level of the incoming RF signal.

One should note that the size selected for the filter capacitor CLPF depends upon the frequency of the input RF signal and the signal modulation. In one embodiment the RMS detector may reside on one integrated circuit with a CLPF pin that provides an external capacitor to be connected in parallel with the on-chip capacitor 24. Having an array of on-chip capacitors allows the RMS filtering time constant to be set digitally.

Figure 5:
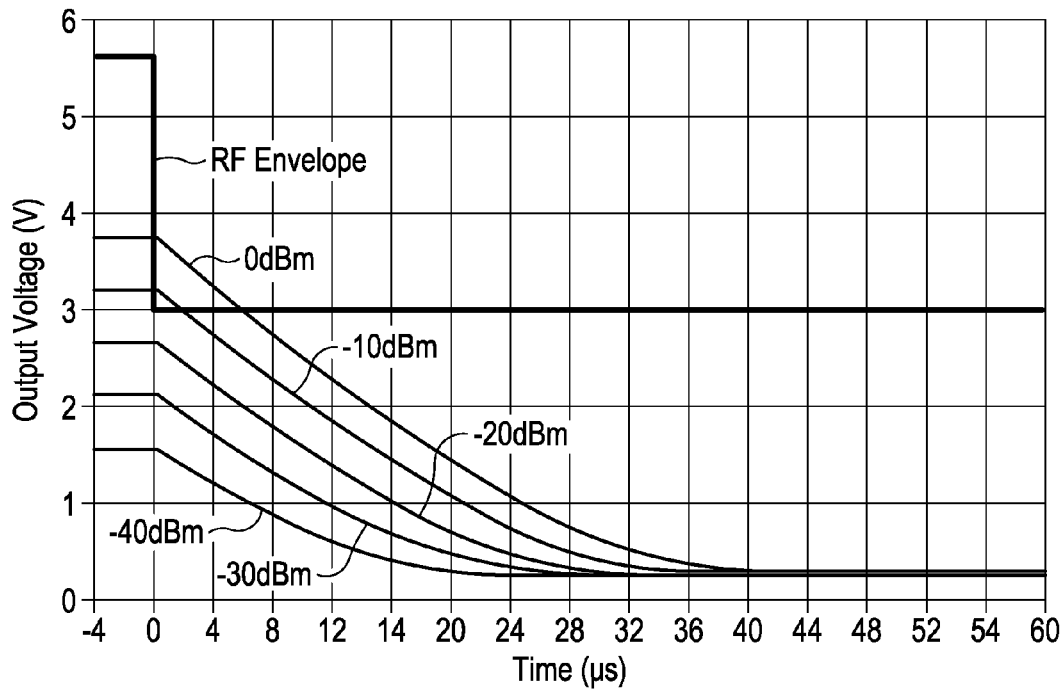
FIGS. 5 and 6 show comparison settling times between a prior-art RMS detector and one implemented according to the embodiments described here.
Figure 6:
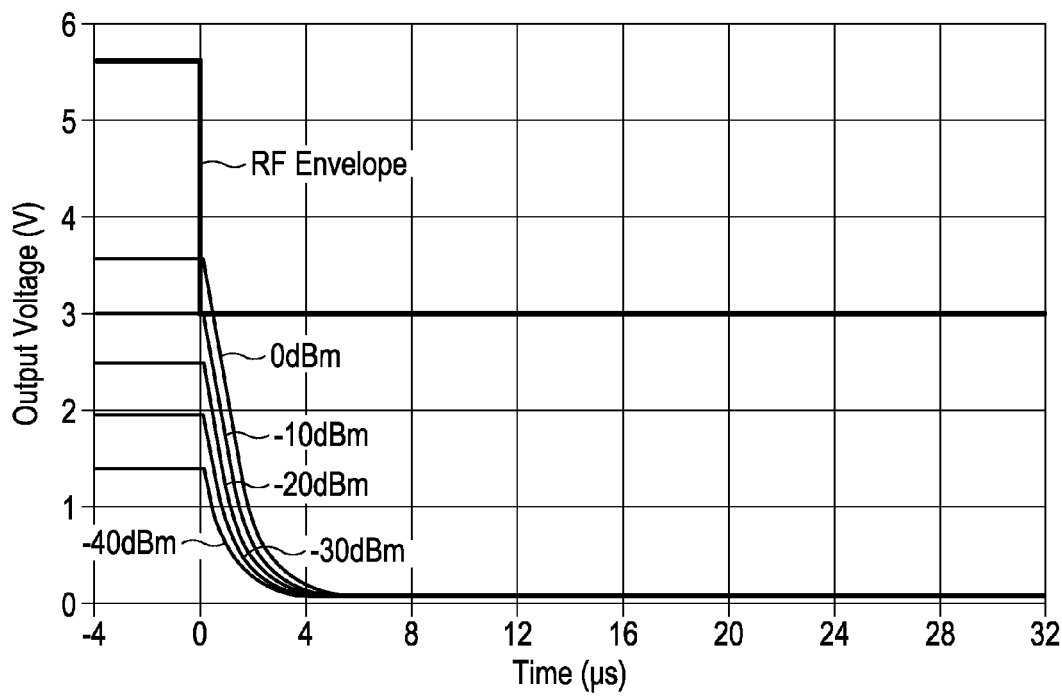

FIGS. 5 and 6 show falling edge settling time data for a prior art RMS detector and an RMS detector created in accordance with the principles set out above for equal CLPF filter capacitors. As can be seen, the prior art RMS detector has a much slower falling edge settling time. As explained earlier, the falling edge is always slower than the rising edge. The top line with the square step is the radio frequency envelope. The various lines represent different power inputs (dBm) and the corresponding measurement output curves. The top curve is for 0 dBm, followed by −10 dBm, −20 dBm, −30 dBm and finally −40 dBm. These same curves are shown in FIG. 6 for an RMS detector with an extra gain stage at the output and a clamping circuit.

In this manner, an RMS detector with a faster settling time is provided. The faster settling time will allow an increased sampling rate of the RMS detector output by an ADC (Analog to Digital Converter). This becomes especially important as the complexity of signals continues to increase.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A root-mean-square (RMS) detector, comprising:
   detection circuitry having as an input a radio frequency signal, target voltage and a set voltage and a RMS signal as an output;
   an output stage within the detection circuitry, the output stage comprising a gain stage and a differential amplifier to produce an output RMS signal.

2. The RMS detector of claim 1, wherein the detection circuitry comprises an input variable gain amplifier having the radio frequency signal and the set voltage as inputs.

3. The RMS detector of claim 1, wherein the detection circuitry comprises: at least two squaring circuits, a first squaring circuit receiving a radio frequency voltage signal as an input and a second squaring circuit receiving a target voltage as an input; and
   a summing circuit to combine outputs of the first and second squaring circuits.

4. The RMS detector of claim 3, wherein the summing circuit includes a current minor to receive the outputs of the first and second squaring circuits and to balance currents from the squaring circuits.

5. The RMS detector of claim 1, wherein the outputs of the gain stage are electrically coupled to resistors having the same values.

6. The RMS detector of claim 1, further comprising a filter capacitor electrically coupled to the output of the RF squaring cell and a current mirror.

7. The RMS detector of claim 6, wherein the RMS detector resides on an RMS integrated circuit and the filter capacitor resides on a filter integrated circuit external to the RMS integrated circuit.

8. The RMS detector of claim 7, wherein the filter integrated circuit has selectable values for the filter capacitor.

9. A root-mean-square (RMS) detector, comprising:
   an input variable gain amplifier having as inputs a radio frequency signal and a set voltage, producing a radio frequency voltage signal;
   at least two squaring circuits, a first squaring circuit having the radio frequency voltage signal as an input and a second squaring circuit having a target voltage as an input;
   a summing circuit to combine outputs of the first and second squaring circuits;
   a gain stage to receive differential output from the summing circuit; and
   differential output amplifier to produce an output RMS signal from an output of the gain stage, the output RMS signal electrically coupled to the set voltage.

10. The RMS detector of claim 9, further comprising a current minor within the summing circuit.

11. The RMS detector of claim 9, wherein outputs of the gain stage are the inputs to an output amplifier.

12. The RMS detector of claim 11, wherein the outputs of the gain stage are electrically coupled to resistors having the same values.

13. The RMS detector of claim 9, further comprising a filter capacitor electrically coupled to the output of the first squaring cell and a current mirror.

14. The RMS detector of claim 13, wherein the RMS detector resides on an RMS integrated circuit and the filter capacitor resides on a filter integrated circuit or eval board external to the RMS integrated circuit.

15. The RMS detector of claim 14, wherein the filter integrated circuit has selectable values for the filter capacitor.

16. A root-mean-square (RMS) detector, comprising:
   an input variable gain amplifier having as inputs a radio frequency signal and a set voltage, producing a radio frequency voltage signal;
   at least two squaring circuits, a first squaring circuit having the radio frequency voltage signal as an input and a second squaring circuit having a target voltage as an input;

a gain stage to electrically coupled to outputs of the first and second squaring circuits, the gain stage producing an output signal; and clamping circuitry electrically coupled to the gain stage to clamp the output signal to a voltage less than a positive rail voltage.

17. The RMS detector of claim 16, further comprising a summing circuit to combine the outputs of the first and second squaring circuits and electrically couple the outputs of the first and second squaring circuits to the gain stage.

18. The RMS detector of claim 16, further comprising an output amplifier to produce an output RMS signal from the output signal of the gain stage, the output RMS signal electrically coupled to the set voltage.

19. The RMS detector of claim 16, further comprising a filter capacitor coupled to the output of the first squaring circuit.

* * * * *

UNITED STATES PATENT AND TRADEMARK OFFICE
CERTIFICATE OF CORRECTION

PATENT NO.       : 8,928,390 B2  
APPLICATION NO.  : 13/848929  
DATED            : January 6, 2015  
INVENTOR(S)      : Eberhard Brunner Page 1 of 1

It is certified that error appears in the above-identified patent and that said Letters Patent is hereby corrected as shown below:

In the Specification

Column 3, line 14, the word "minor" should be replaced with -- mirror --.

Column 3, line 20, the word "minor" should be replaced with -- mirror --.

Column 3, line 24, the word "minor" should be replaced with -- mirror --.

In the Claims

Column 4, line 15, the word "minor" should be replaced with -- mirror --.

Signed and Sealed this  
Nineteenth Day of May, 2015

Michelle K. Lee  
*Director of the United States Patent and Trademark Office*